US009659982B2

(12) United States Patent
Zhang

(10) Patent No.: US 9,659,982 B2
(45) Date of Patent: May 23, 2017

(54) IMAGE SENSOR PIXEL STRUCTURE WITH OPTIMIZED UNIFORMITY

(71) Applicant: CISTA SYSTEM CORP., Grand Cayman (KY)

(72) Inventor: Guangbin Zhang, Cupertino, CA (US)

(73) Assignee: CISTA SYSTEM CORP., Grand Cayman (KY)

( * ) Notice: Subject to any disclaimer, the term of this patent is extended or adjusted under 35 U.S.C. 154(b) by 42 days.

(21) Appl. No.: 14/664,614

(22) Filed: Mar. 20, 2015

(65) Prior Publication Data

US 2015/0294999 A1 Oct. 15, 2015

Related U.S. Application Data

(60) Provisional application No. 61/978,203, filed on Apr. 11, 2014.

(51) Int. Cl.
*H01L 27/146* (2006.01)

(52) U.S. Cl.
CPC .. *H01L 27/14605* (2013.01); *H01L 27/14621* (2013.01); *H01L 27/14641* (2013.01); *H01L 27/14645* (2013.01)

(58) Field of Classification Search
CPC ......... H01L 27/14605; H01L 27/14621; H01L 27/14641; H01L 27/14645
See application file for complete search history.

(56) References Cited

U.S. PATENT DOCUMENTS

| 7,638,826 | B2 * | 12/2009 | Hiyama | H01L 27/14603 257/231 |
| 9,185,319 | B2 * | 11/2015 | Mayer | H01L 27/14603 |
| 9,257,465 | B2 * | 2/2016 | Ishiwata | H01L 27/14609 |
| 2009/0053848 | A1 * | 2/2009 | Fan | H01L 27/14603 438/59 |
| 2012/0312964 | A1 * | 12/2012 | Yamashita | H04N 5/37457 250/208.1 |
| 2013/0194471 | A1 * | 8/2013 | Yamashita | H04N 5/374 348/308 |

* cited by examiner

*Primary Examiner* — Amy Hsu

(57) ABSTRACT

An image sensor includes at least a first row and a second row of photodiodes, each photodiode being coupled with an associated transistor, each associated transistor including a gate, the first and second row of photodiodes forming a series of 2×2 Bayer-pattern units. In each Bayer-pattern unit, a first photodiode and a second photodiode in the first row are designated respectively as a first green pixel and a blue pixel, and a third photodiode and a fourth photodiode in the second row are designated respectively as a red pixel and a second green pixel, wherein a position of the gate of the transistor associated with the first photodiode relative to the first photodiode and a position of the gate of the transistor associated with the fourth photodiode relative to the fourth photodiode are the same.

23 Claims, 7 Drawing Sheets

IMAGE SENSOR PIXEL STRUCTURE WITH OPTIMIZED UNIFORMITY

CROSS REFERENCE TO RELATED APPLICATION

This application claims the benefit of priority to U.S. Provisional Application No. 61/978,203, filed with the United States Patent and Trademark Office on Apr. 11, 2014, and entitled "AN IMAGE SENSOR PIXEL STRUCTURE WITH OPTIMIZED UNIFORMITY," which is hereby incorporated by reference in its entirety.

TECHNICAL FIELD

The present disclosure relates to image sensor, in particular, to layouts of Complementary Metal Oxide Semiconductor (CMOS) image sensors.

BACKGROUND INFORMATION

Most of the imaging sensors today use a color filter constructed using a Bayer-pattern type color format, which is composed of four color plates, i.e., B (blue), Gb (green in blue row), R (red), and Gr (green in red row). The color filter can superimposed over active pixels of the image sensor. The active pixels can sense the filtered light going through the color filter, and the final image density and color sensed by an active pixel can be interpolated from the nearby Bayer pattern pixels. The effective image resolution of such a CMOS image sensor can be affected by a difference in sensitivity between the active pixels used for sensing light filtered by the Gb and Gr portions of the color filter.

SUMMARY

The present disclosure provides an image sensor comprising at least a first row and a second row of photodiodes, each photodiode being coupled with an associated transistor, each associated transistor including a gate, the first and second row of photodiodes forming a series of 2×2 Bayer-pattern units. In some embodiments, in each Bayer-pattern unit, a first photodiode and a second photodiode in the first row are designated respectively as a first green pixel (e.g., Gb) and a blue pixel, and a third photodiode and a fourth photodiode in the second row are designated respectively as a red pixel and a second green pixel (e.g., Gr), wherein a position of the gate of the transistor associated with the first photodiode relative to the first photodiode and a position of the gate of the transistor associated with the fourth photodiode relative to the fourth photodiode are the same.

In some embodiments, an orientation of the gate of the transistor associated with the first photodiode relative to the first photodiode and an orientation of the gate of the transistor associated with the fourth photodiode relative to the fourth photodiode are also the same. In some embodiments, the outputs of at least some of the photodiodes of each row are configured to be accessible at substantially the same time.

In some embodiments, the first photodiode designated as the first green pixel and the fourth photodiode designated as the second green pixel are arranged diagonally within a 2×2 Bayer-pattern unit.

In some embodiments, the image sensor further comprises a reset transistor coupled with the node, wherein the reset transistor is configurable to set a predetermined voltage at the node. The image sensor may further include a buffer transistor coupled with node, wherein the buffer transistor is configured to generate an output voltage based on a voltage at the node. In some embodiments, the image sensor may further include a selection transistor, wherein the selection transistor is configurable to transmit a voltage at the node.

In some embodiments, the gate of the transistor associated with the first photodiode is coupled with a first control line; the gate of the transistor associated with the second photodiode is coupled with a second control line; the gate of the transistor associated with the third photodiode is coupled with a third control line; and the gate of the transistor associated with the fourth photodiode is coupled with a fourth control line.

In some embodiments, the first, second, third, and fourth control lines are configured to enable the first photodiode to be selected to provide an output before the second photodiode, and the fourth photodiode to be selected to provide an output before the third photodiode. The first, second, third, and fourth control lines are configured to enable the first photodiode, the second photodiode, the third photodiode, and the fourth photodiode to be selected individually to provide one or more outputs at different times.

The present disclosure also provides a method of acquiring an output of an image sensor, the image sensor comprising a series of a 2×2 Bayer-pattern units each including a first photodiode designated as a first green pixel, a second photodiode designated as a blue pixel, a third photodiode designated as a red pixel, and a fourth photodiode designated as a second green pixel. The method comprises obtaining an output generated by the first photodiode before acquiring an output generated by the second photodiode, and obtaining an output generated by the fourth photodiode before acquiring an output generated by the third photodiode.

In some embodiments, the obtaining an output generated by the fourth photodiode before acquiring an output generated by the third photodiode further comprises: resetting the node; obtaining the output generated by the fourth photodiode after resetting the node; and obtaining the output generated by the third photodiode after obtaining the output generated by the fourth photodiode.

The present disclose also provides an image sensor including at least a first row and a second row of photodiodes, each photodiode being coupled with an associated transistor, each associated transistor including a gate. The first and second row of photodiodes form a series of 2×2 units (e.g., square/rectangular units). Each unit may include a first photodiode, a second photodiode, a third photodiode, and a fourth photodiode. The first and the fourth photodiodes are arranged diagonally and the second and the third photodiodes are arranged diagonally within the square. A position of a gate of a transistor associated with the first photodiode relative to the first photodiode is the same as a position of a gate of a transistor associated with the fourth photodiode relative to the fourth photodiode.

DETAILED DESCRIPTION OF THE DRAWINGS

Reference will now be made in detail to the exemplary embodiments consistent with the embodiments disclosed herein and the examples of which are illustrated in the accompanying drawings. Wherever possible, the same reference numbers will be used throughout the drawings to refer to the same or similar parts.

Figure 1:
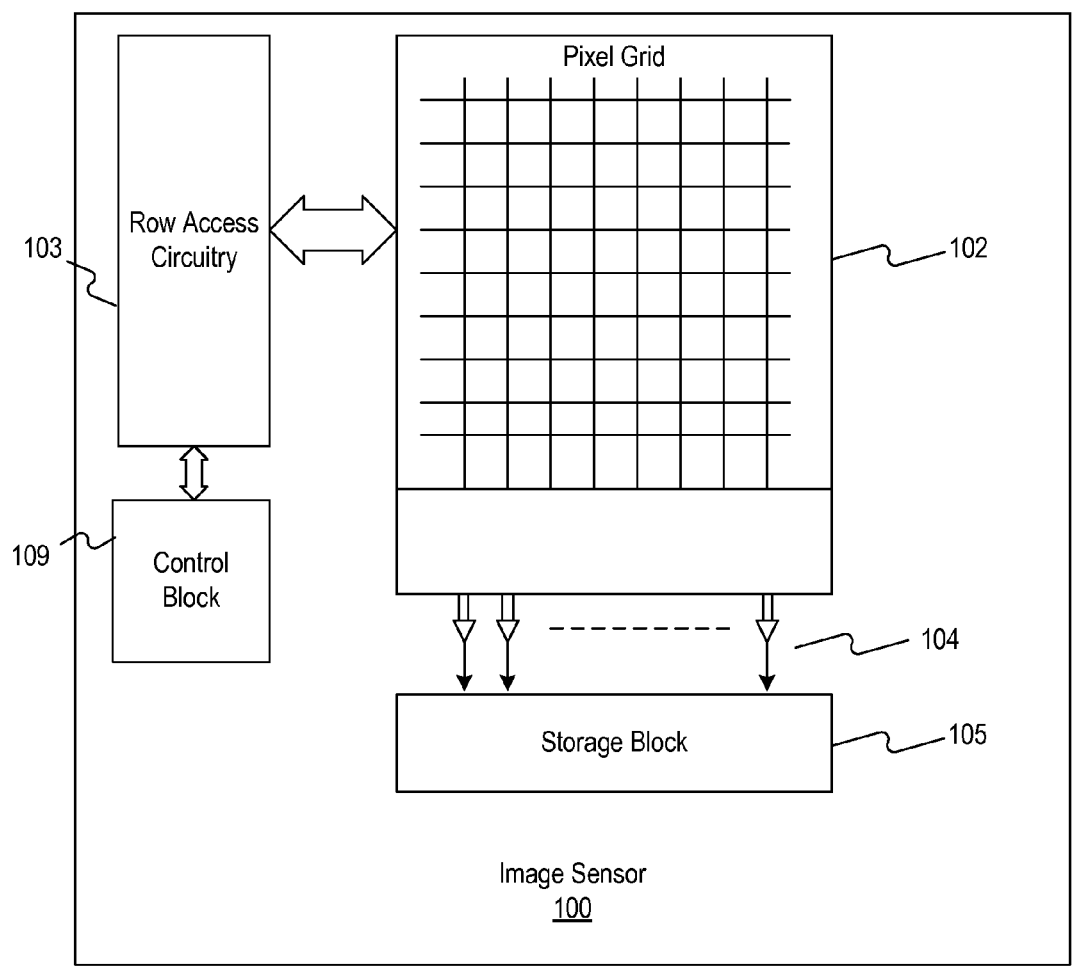
FIG. 1 is a diagram illustrating an exemplary image sensor.

FIG. 1 is a diagram illustrating an image sensor 100, within which examples of pixel structures consistent with the present disclosure can be used. Image sensor 100 can be a CMOS type image sensor or any other type of image sensors. Image sensor 100 may include a two-dimensional pixel grid 102, a row access circuitry 103, a set of comparators 104, a storage block 105, and a control block 109. The image sensor circuitry is divided into blocks as shown in FIG. 1 for illustration purpose. A person having ordinary skill in the art should understand that at least some of these blocks can be integrated together on one chip.

Pixel grid 102 includes multiple pixels for sensing light signals and converting the light signals to electrical signals. Each pixel includes a photodiode that can generate a certain amount of charges that is proportional to the energy of the sensed light signal. The charges generated can be deposited at a capacitor (e.g., parasitic capacitance at a drain terminal or a source terminal of a transistor) to form a voltage. As to be described later, each pixel is also associated with a readout transistor. The readout transistor can be enabled or disabled to control the accessibility of the voltage (or the charges) generated by the photodiode. In some embodiments, the output terminals (e.g., a drain terminal) of multiple readout transistors associated with multiple pixels is joined together to form a common output node (also referred to as a floating drain node), to reduce the number of wires and additional transistors needed to access the output of the pixels. At any one time, the output of one of the pixels can be propagated to the floating drain, depending on which of the readout transistors is enabled.

As shown in FIG. 1, pixel grid 102 is electrically coupled to row access circuitry 103. Row accessing circuitry 103 can select one row at a time in pixel grid 102, by enabling at least some of the readout transistors associated with at least some of the pixels in the row. The voltages (or charges) generated by the photodiodes in the row can then be obtained and transmitted to comparators 104, which can then convert the voltages into digital signals. The digital signals can then be transmitted to and stored at storage block 105. Row accessing circuitry 103 can be controlled by control block 109, which provides control signals to row accessing circuitry 103 to control the speed and sequence of accessing the rows in pixel grid 102. After all the rows of pixel grid 102 are selected, and all pixel data are obtained and processed, the image sensed by pixel grid 102 can be represented by a two-dimensional grid of digital representations, which can be used to form a digital image. The digital signals representing the digital image after processing the pixel data can also be stored in storage block 105.

Typically, a color filter (not shown in FIG. 1) is superimposed over pixel grid 102 to provide light signal within certain spectrums for pixel grid 102. Such a color filter can be constructed using a Bayer-pattern type color format, which can be composed of four color plates, i.e. B (blue), Gb (green in blue row), R (red), and Gr (green in red row). Each pixel of pixel grid 102 can sense the filtered light going through a portion of the color filter superimposing over the pixel, and the final image density and color sensed by an active pixel can be found by interpolating from the nearby Bayer pattern pixels. A person having ordinary skill in the art should understand that how the interpolation can be performed.

The effective image resolution of an image sensor can be affected by a difference in sensitivity between the Gb and Gr active pixels. For example, the Gb and Gr active pixels can generate different voltages or amount of charges when sensing the same amount of light energy. Such a difference, also commonly known as "Gb-Gr difference," can introduce errors in the interpolation, and the effective image resolution is reduced as a result.

The Gb-Gr difference, and the resultant reduction in effective image resolution, can be introduced and/or exacerbated by current techniques of joining together multiple readout transistors to reduce the number of circuits needed to process the output of the pixels, as described before.

Figure 2:
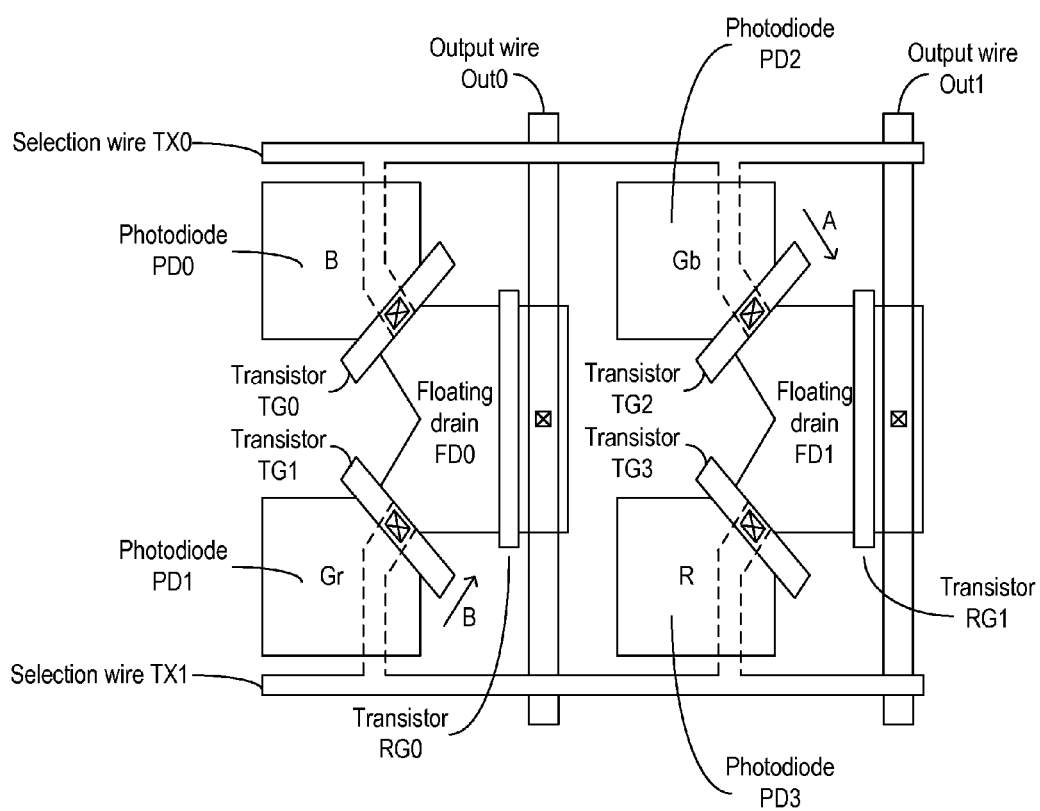
FIG. 2 is a diagram illustrating a prior art image pixel structure.

Reference is now made to FIG. 2, which illustrates a prior art image pixel structure 200. As shown in FIG. 2, image pixel structure 200 includes photodiodes PD0, PD1, PD2, and PD3, which can form a 2×2 Bayer pattern (four adjacent pixels in a square), in which photodiode PD0 can be designated as a B pixel, photodiode PD1 can be designated as a Gr pixel, photodiode PD2 can be designated as a Gb pixel, and photodiode PD3 can be designated as a R pixel. Photodiode PD0 is associated with a readout transistor TG0, photodiode PD1 is associated with a readout transistor TG1, photodiode PD2 is associated with a readout transistor TG2, and photodiode PD3 is associated with a readout transistor TG3. The drain terminals of transistors TG0 and TG1 join together to form a floating drain FD0. The drain terminals of transistors TG2 and TG3 also join together to form a floating drain FD1. The gates of transistors TG0 and TG2 are coupled with a selection wire TX0, which can transmit a control signal configured to enable or disable transistors TG0 and TG2 together. The gates of transistors TG1 and TG3 are also coupled with a selection wire TX1, which can transmit a control signal configured to enable of disable transistors TG1 and TG3 together. Image pixel structure 200 further includes transistors RG0 and RG1, which can provide buffering and conditioning (e.g., setting a voltage bias level) to the outputs of floating drains FD0 and FD1, before transmitting the outputs of floating drains FD0 and FD1 to, respectively, output wires Out0 and Out1.

When transistors TG0 and TG2 are enabled (and transistors TG1 and TG3 are disabled), floating drain FD0 can be propagated with the output generated by photodiode PD0, and floating drain FD1 can be propagated with the output generated by photodiode PD1. When transistors TG1 and TG3 are enabled (and transistors TG0 and TG2 are disabled), floating drain FD0 can be propagated with the output generated by photodiode PD1, and floating drain FD1 can be propagated with the output generated by photodiode PD3.

When image pixel structure 200 of FIG. 2 is incorporated into image sensor 100 of FIG. 1, selection wire TX0 and TX1 can be controlled by row access circuitry 103, which in turn is controlled by control block 109. Row access circuitry 103 can provide the control signals on selection wires TX0 and TX1 such that the outputs of a first row of photodiodes, including photodiodes PD0 and PD2, are obtained first, followed by the outputs of a second row of photodiodes, including photodiodes PD1 and PD2. Output wires Out0 and Out1 can be fed to comparators 104 to convert the voltages at floating drains FD0 and FD1 into digital signals to be stored at storage block 105.

Image pixel structure 200 of FIG. 2 can introduce both geometric and time-domain non-uniformities between photodiode PD1 (designated as the Gr pixel) and photodiode PD2 (designated as the Gb pixel). Such non-uniformities introduce and/or exacerbate the previously described Gb-Gr difference.

Geometric non-uniformity between photodiodes PD1 and PD2 can be introduced because the gates of the associated readout transistors TG1 and TG2 are placed in different orientations and positions with respect to photodiodes PD1 and PD2. For example, as shown in FIG. 2, transistor TG2 is positioned at the bottom-right corner of photodiode PD2, and is oriented towards a direction A with respect to photodiode PD2 and floating drain FD1, while transistor TG1 is positioned at the top-right corner of photodiode PD1, and is oriented towards a direction B with respect to photodiode PD1 and floating drain FD0. As shown in FIG. 2, directions A and B are different.

The differences in the positioning and orientation of transistors TG1 and TG2 with respect to photodiodes PD1 and PD2 can contribute to geometric non-uniformity in at least two ways. First, some steps of semiconductor fabrication process can be sensitive to layout directions, and differences in device parameters can be introduced when the fabricated devices are oriented in different directions. As a result, when readout transistors TG1 and TG2 are oriented differently with respect to photodiodes PD1 and PD2, transistor TG1 may have different device characteristics than transistor TG2, and portions of photodiodes PD1 and PD2 (e.g., the portions at the vicinities of transistors TG1 and TG2) may have different device characteristics as well, due to the difference in the orientations of transistors TG1 and TG2. Second, transistors TG1 and TG2 (and their associated metal routings) can block, reflect, or otherwise affect incident light differently due to their different orientations. As a result, photodiodes PD1 and PD2 can receive different amounts of light and produce different voltages, when in fact the same amount of light is received by the image sensor at the locations of photodiodes PD1 and PD2. As a result of these geometric non-uniformities, the designated Gr and Gb pixels (e.g., photodiodes PD1 and PD2) can exhibit differences in sensitivity to light, therefore giving rise to the aforementioned Gb-Gr difference.

Image pixel structure 200 of FIG. 2 can also introduce time-domain non-uniformity. As discussed before, typically the pixels are accessed row by row. For example, in image pixel structure 200, the outputs of photodiodes PD0 and PD2 are obtained first when enabled via selection wire TX0, followed by the outputs of photodiodes PD1 and PD2 when enabled via selection wire TX1. As a result of such an arrangement, the output of photodiode PD2 (designated as Gb pixel) is read before the output of photodiode PD3 (designated as R pixel), with which photodiode PD2 shares floating drain FD1. On the other hand, the output of photodiode PD1 (designated as Gr pixel) is read after the output of photodiode PD0 (designated as B pixel), with which photodiode PD1 shares floating drain FD0.

The difference between the order of reading the Gb and R pixels, and the order of reading the Gr and B pixels, can introduce differences in the sensitivities of the Gb and Gr pixels. As the floating drain is switched between two photodiodes, charges from the previously-selected photodiode and the associated metal routing can be coupled into the floating drain via parasitic coupling capacitors during the switching. As a result, there can be residual charges at the floating drain before the later-selected photodiode starts depositing charges. Thus, the total charges stored at floating drain FD0 after charges are deposited by the Gr pixel (photodiode PD1), can be different from the total charges stored at floating drain FD1 after charges are deposited by the Gb pixel (photodiode PD2), even if both photodiodes PD1 and PD2 receive the same amount of light. The time-domain non-uniformity between Gb and Gr pixels can lead to, for example, Gb pixels showing different noise and fixed-pattern performance than Gr pixels, and further increases the Gb-Gr difference.

Moreover, in image pixel structure 200, each pixel within a row is coupled with, individually, one output wire. For example, photodiode PD0 is coupled with output wire Out0, while photodiode PD2 is coupled with output wire Out1. As a result, each pixel included in the row will generate data at the same time, and processing circuits will be needed to process all these data. For example, if each row of image pixel structure 200 includes 1080 pixels, 1080 comparators will be required to process each of the 1080 pixels. This can lead to a requirement of substantial amount of dedicated circuits, especially when large number of pixels is included in the pixel grid to improve the resolution of captured image.

Figure 3:
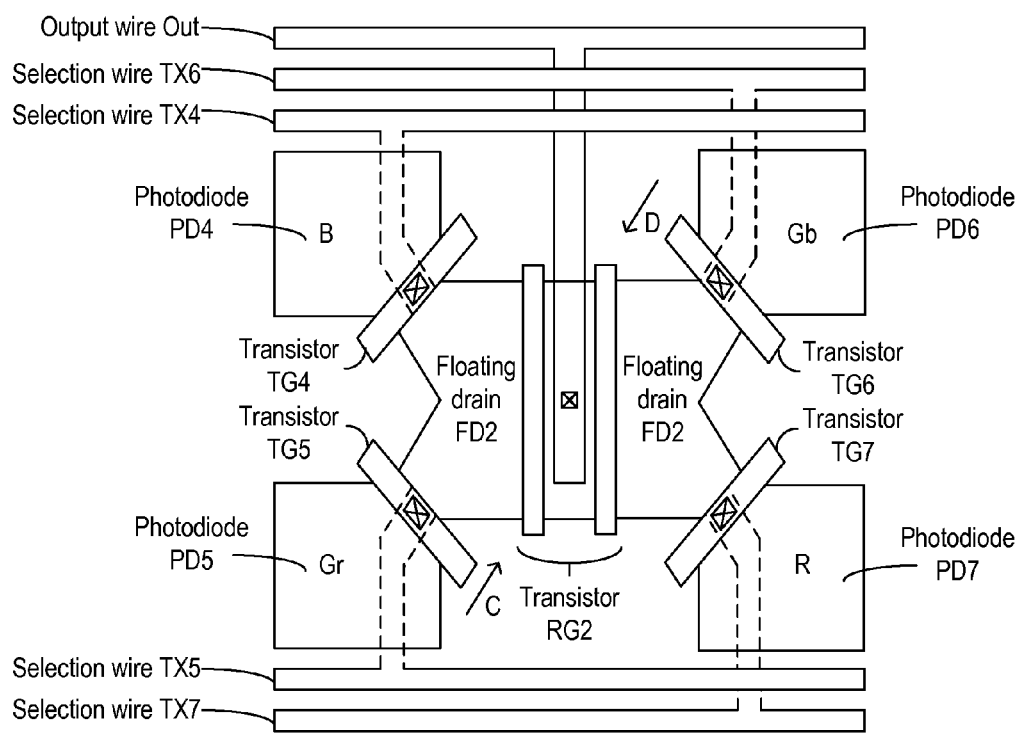
FIG. 3 is a diagram illustrating a prior art image pixel structure.

Reference is now made to FIG. 3, which illustrates another prior art image pixel structure 300. As shown in FIG. 3, image pixel structure 300 includes photodiodes PD4, PD5, PD6, and PD7, which can form a 2×2 Bayer pattern, in which photodiode PD4 can be designated as a B pixel, photodiode PD5 can be designated as a Gr pixel, photodiode PD6 can be designated as a Gb pixel, and photodiode PD7 can be designated as a R pixel. Photodiode PD4 is associated with a readout transistor TG4, photodiode PD5 is associated with a readout transistor TG5, photodiode PD6 is associated with a readout transistor TG6, and photodiode PD7 is associated with a readout transistor TG7. The drain terminals of transistors TG0 and TG1 join together to form a floating drain FD2. The drain terminals of transistors TG2 and TG3 also join together at floating drain FD2. The gates of transistors TG4, TG5, TG6, and TG7 are coupled with, respectively, selection wires TX4, TX5, TX6, and TX7, each of which can transmit a control signal configured to enable or disable the associated readout transistor. Image pixel structure 300 further includes transistor RG2, which can provide buffering and conditioning (e.g., setting a voltage bias level) to floating drain FD2, before transmitting the output of floating drain FD2 to output wire Out. Section wires TX4, TX5, TX6, and TX7 can be coupled with row access circuitry 103 of FIG. 1, while output wire Out can be coupled with comparators 104 of FIG. 1.

Image pixel structure 300 of FIG. 3 introduces similar geometric non-uniformities as image pixel structure 200 of FIG. 2. This is because the gates of the associated readout transistors TG5 and TG6 are placed in different orientations and positions with respect to photodiodes PD5 and PD6 (designated as Gr and Gb pixels respectively). For example, as shown in FIG. 3, transistor TG5 is positioned at the top-right corner of photodiode PD5, and is oriented towards a direction C with respect to photodiode PD5 and floating drain FD2, while transistor TG6 is positioned at the bottom-left corner of photodiode PD6, and is oriented towards a direction D with respect to photodiode PD6 and floating drain FD2. As shown in FIG. 3, directions C and D are different. Therefore, similar to image pixel structure 200 of FIG. 2, image pixel structure 300 of FIG. 3 can also introduce geometric non-uniformity, which contributes to the Gb-Gr difference between photodiode diodes PD5 and PD6.

Figure 4A:
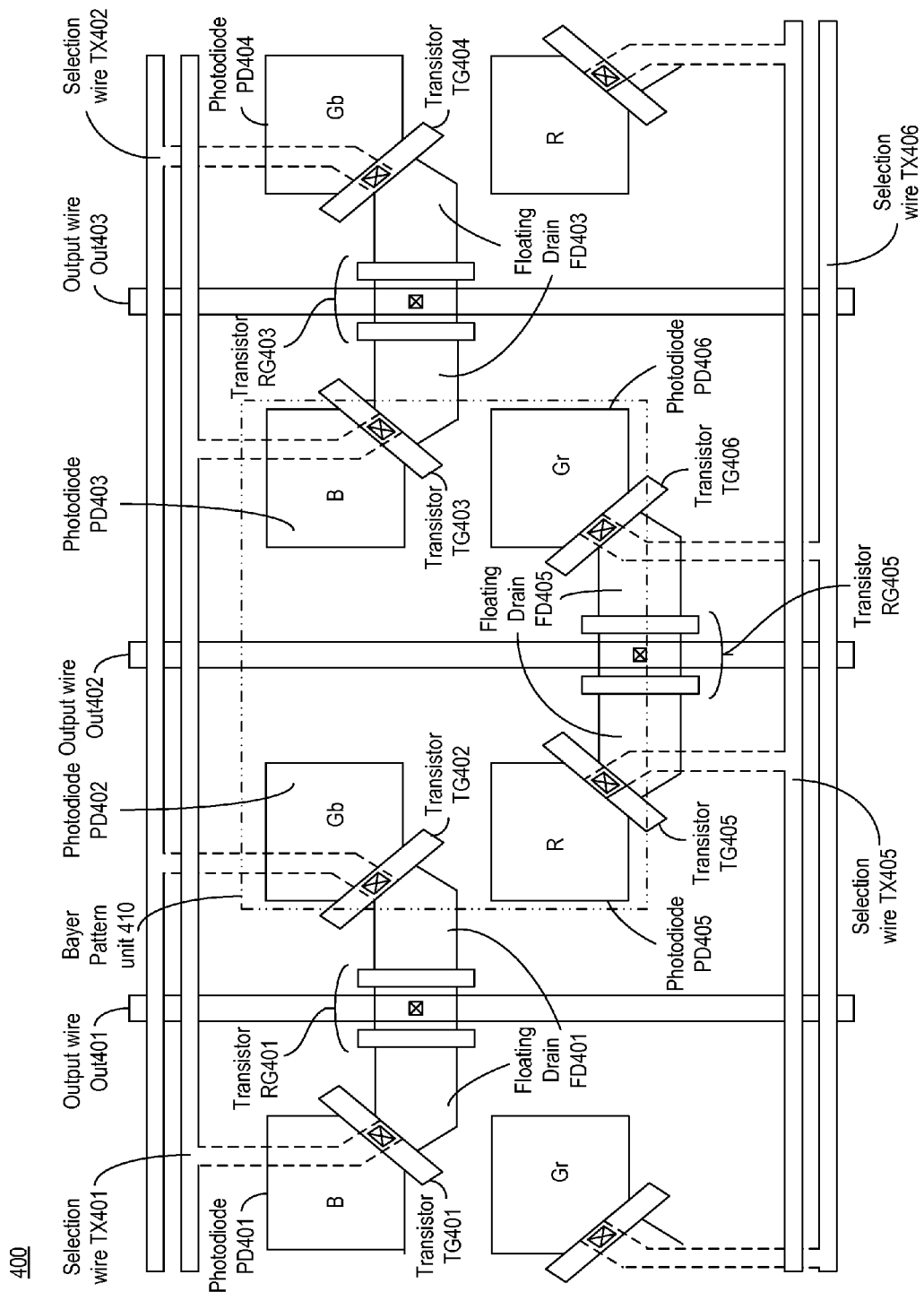
FIGS. 4A and 4B are diagrams illustrating examples of an image pixel structure, consistent with disclosed embodiments.
Figure 4B:
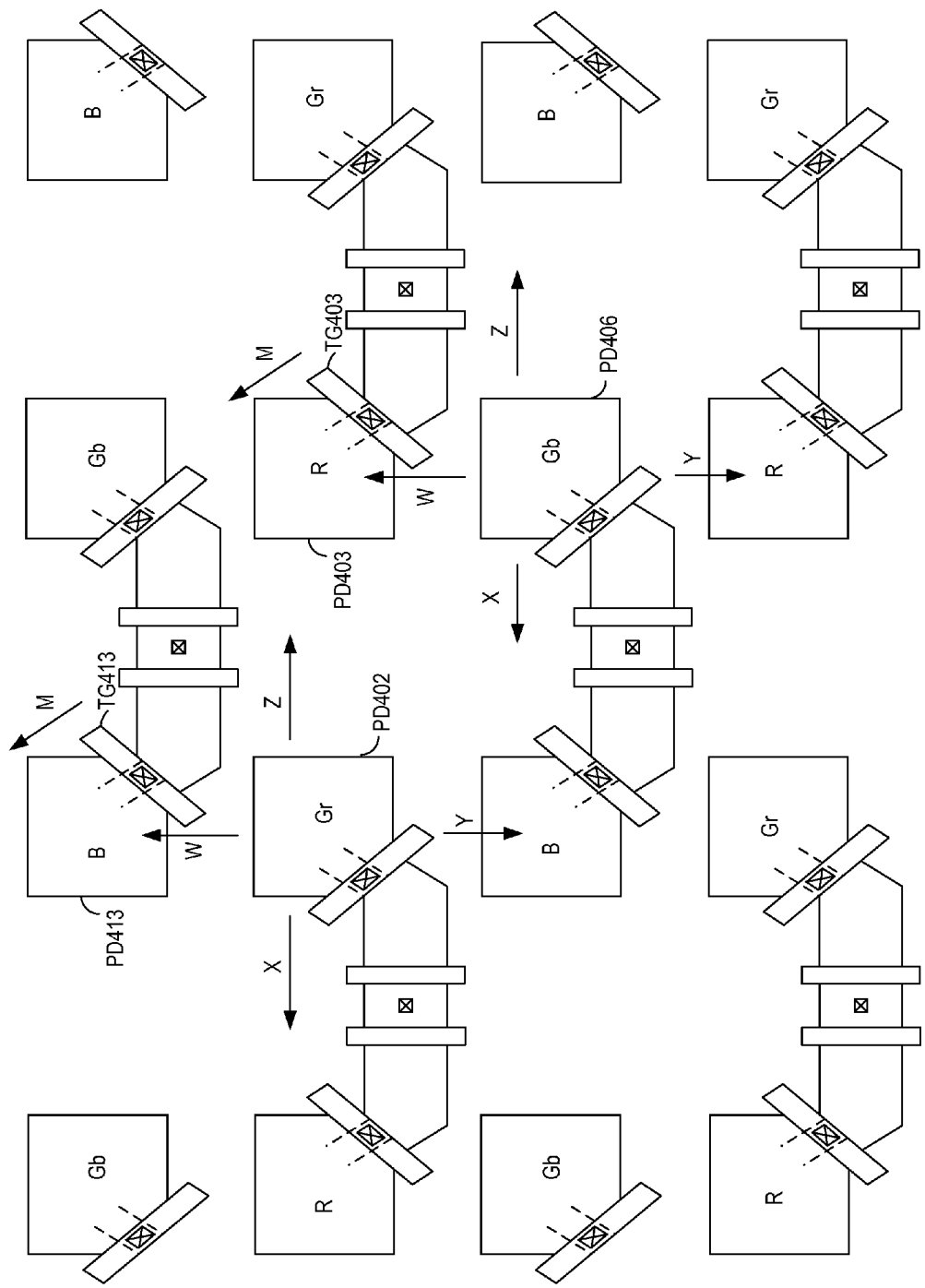

FIGS. 4A and 4B are diagrams illustrating examples of an image pixel structure, consistent with disclosed embodiments, which can address the aforementioned non-uniformities associated with the prior art image pixel structures depicted in FIG. 2 and FIG. 3. In some embodiments, image pixel structure 400 includes a plurality of paired structures of photodiodes, in which the photodiodes shares a floating drain, and the paired structures are arranged repeatedly in every row. For example, as shown in FIG. 4A, the first row of image pixel structure 400 includes a paired structure of photodiodes PD401 and PD402, and a paired structure of photodiodes PD403 and PD404. Each paired structure includes a shared floating drain, and two readout transistors controlling which of the photodiodes in the pair has access to the floating drain. For example, the paired structure of photodiodes PD401 and PD402 includes floating drain a FD401 shared by the photodiodes, and readout transistors TG401 and TG402, while the paired structure of photodiodes PD403 and PD404 includes a floating drain FD403 shared by the photodiodes, and readout transistors TG403 and TG404.

As shown in FIG. 4A, in some embodiments, each paired structure is identical to each other and has identical arrangement of components. For example, the position and orientation of transistor TG401 with respect to photodiode PD401 are identical to the position and orientation of transistor TG403 with respect to photodiode PD403. Likewise, the position and orientation of transistor TG402 with respect to photodiode PD402 are identical to the position and orientation of transistor TG404 with respect to photodiode PD404. In the illustrative example shown in FIG. 4A, the photodiodes of the first row are designated for B and Gb pixels. Photodiodes PD401 and PD403 are designated as B pixels, while photodiodes PD402 and PD404 are designated as Gb pixels.

The second row of image pixel structure 400 also includes a plurality of paired structures of photodiodes that are identical to the paired structures of photodiodes of the first row. For example, as shown in FIG. 4B, the second row includes a paired structure of photodiodes PD405 and PD406. The paired structure also includes a floating drain FD405 shared by the photodiodes, and readout transistors TG405 and TG406. The paired structure of photodiodes PD405 and PD406 is identical to both the paired structure of photodiodes PD401 and PD402, and the paired structure of photodiodes PD403 and PD404. For example, as shown in FIG. 4A, the position and orientation of transistor TG405 with respect to photodiode PD405 are identical to the position and orientation of transistor TG401 with respect to photodiode PD401, and are also identical to the position and orientation of transistor TG403 with respect to photodiode PD403. Likewise, the position and orientation of transistor TG406 with respect to photodiode PD406 are identical to the position and orientation of transistor TG402 with respect to photodiode PD402, and are also identical to the position and orientation of transistor TG404 with respect to photodiode PD404. In the illustrative example shown in FIG. 4A, the photodiodes of the second row are designated for R and Gr pixels. The paired structures of photodiodes in the second row are also shifted by one pixel pitch when compared with the corresponding paired structures in the first row, and the photodiodes in the first row and in the second row can be used to form 2×2 Bayer pattern units. For example, photodiode PD405 is designated as R pixel, while photodiode PD406 is designated as Gr pixel, and together with photodiodes PD402 and PD403, form a 2×2 Bayer pattern unit 410, with the Gb pixel and the Gr pixel arranged diagonally and the B pixel and the R pixel arranged diagonally within the 2×2 Bayer-pattern unit. The first row and the second row can be repeated, as shown in FIG. 4B.

As shown in FIG. 4A, with image pixel structure 400, photodiodes PD402 and PD406, which are designated as Gb and Gr pixels respectively, have improved geometry uniformity. Their associated readout transistors, TG402 and TG406, have identical position and orientation with respect to photodiodes PD402 and PD406. Also, referring to FIG. 4B, as the rows are repeated, Gr pixel and Gb pixel are neighbored with photodiodes or readout transistors in four directions. The geometric relationship between the Gr pixel and the neighboring photodiode (and/or readout transistor), and the geometric relationship between the Gb pixel and the neighboring photodiode (and/or readout transistor), are identical along any of directions W, X, Y, and Z. For example, photodiode PD402, designated as a Gr pixel, neighbors with a photodiode PD413 and a readout transistor TG413, along the W direction, with transistor TG413 being oriented along a M direction. On the other hand, photodiode PD406, designated as a Gb pixel, neighbors with photodiode PD403 and readout transistor TG403, also along the W direction, and with transistor TG403 also being oriented along the M direction. Similar geometric uniformity is also shown along directions X, Y, and Z. As a result, geometric uniformity between the Gr and Gb pixels can be improved. Moreover, as shown in FIG. 4A, for photodiodes PD405 and PD406, their associated readout transistors, TG405 and TG403, also have identical position and orientation with respect to photodiodes PD405 and PD406.

As shown in FIGS. 4A and 4B, any of the four adjacent photodiodes, including two in one row and two in the next row, form a square, and the two diagonal-arranged pixels have the same layout (e.g., the gate of the transistor is at the same position and orientation relative to the photodiode).

Referring back to FIG. 4A, image pixel structure 400 further includes selection wires TX401, TX402, TX405, and TX406. Selection wire TX401 can transmit a control signal configured to enable TG401 and TG403, so that floating drains FD401 and FD403 can be propagated with, respectively, the outputs of photodiodes PD401 and PD403, both of which are designated as B pixels. Selection wire TX402 can transmit a control signal configured to enable TG402 and TG404, so that floating drains FD401 and FD403 can be propagated with, respectively, the outputs of photodiodes PD402 and PD404, both of which are designated as Gb pixels. Selection wire TX405 can transmit a control signal configured to enable TG405 so that floating drain FD405 can be propagated with the output of photodiode PD405, which is designated as R pixel. Selection wire TX406 can transmit a control signal configured to enable TG405 so that floating drain FD405 can be propagated with the output of photodiode PD406, which is designated as Gr pixel. Image pixel structure 400 further includes transistors RG401, RG403, and RG405 to provide conditioning (e.g., setting a voltage bias level) to the outputs at, respectively, floating drains FD401, FD403, and FD405. The outputs of floating drains FD401, FD403, and FD405 can be accessed via, respectively, output wires Out401, Out402, and Out403. In some embodiments, selection wires TX401, TX402, TX405, and TX406 are coupled with row access circuitry 103 of FIG. 1, which supplies the control signals. Output wires Out401, Out402, and Out403 can be coupled with comparators 104 of FIG. 1, which can convert the voltages at the output wires to digital signals to be stored at storage block 105 of FIG. 1.

With selection wires TX401, TX402, TX405, and TX406 controlling, individually, access to B pixel, Gb pixel, R pixel, and Gr pixel, image pixel structure 400 allows improved time-domain uniformity between Gb and Gr pixels. For example, the control signals on the selection wires can be timed such that when each row is being accessed, the Gb pixel is accessed before the B pixel, and the Gr pixel is accessed before the R pixel. For example, when accessing the first row of image pixel structure 400, transistor TG402 is first enabled (with transistor TG401 disabled), with a first combination of control signals at selection wires TX401 and TX402, to obtain the data generated by photodiode PD402 (designated as the Gb pixel). And then, transistor TG401 is enabled (with transistor TG402 disabled), with a second combination of control signals at selection wires TX401 and TX402, to obtain the data generated by photodiode PD401 (designated as the B pixel). The same reading sequence also applies to other paired structures of photodiodes included in the first row, including photodiodes PD403 and PD404.

Similarly, when accessing the second row of image pixel structure 400, transistor TG406 is first enabled (with transistor TG405 disabled), with a first combination of control signals at selection wires TX405 and TX406, to obtain the data generated by photodiode PD406 (designated as the Gr pixel). And then, transistor TG405 is enabled (with transistor TG406 disabled), with a second combination of control signals at selection wires TX405 and TX406, to obtain the data generated by photodiode PD401 (designated as the R pixel). Since the same order of reading is maintained between Gb and Gr pixels (e.g., both Gb and Gr pixels are read first with respect to the other pixels with which they share the floating drains), time-domain uniformity can be improved.

Moreover, as shown in FIG. 4A, each paired structure of photodiodes includes one floating drain and is coupled with one output wire (e.g. output wire Out401). As a result, for every row, only half of the photodiodes have data to be obtained and processed. This allows the number of processing circuits (e.g. comparators 104 of FIG. 1) for image pixel structure 400 to be reduced by half compared with the image pixel structure 200 in FIG. 2 having the same number of pixels (and photodiodes) in each row. For example, if each row of image pixel structure 400 includes 1080 pixels, only 540 comparators are required to process the data from each row of pixels, whereas an image pixel structure 200 having 1080 pixels per row will require 1080 comparators to process the data from each row of pixels.

Figure 5:
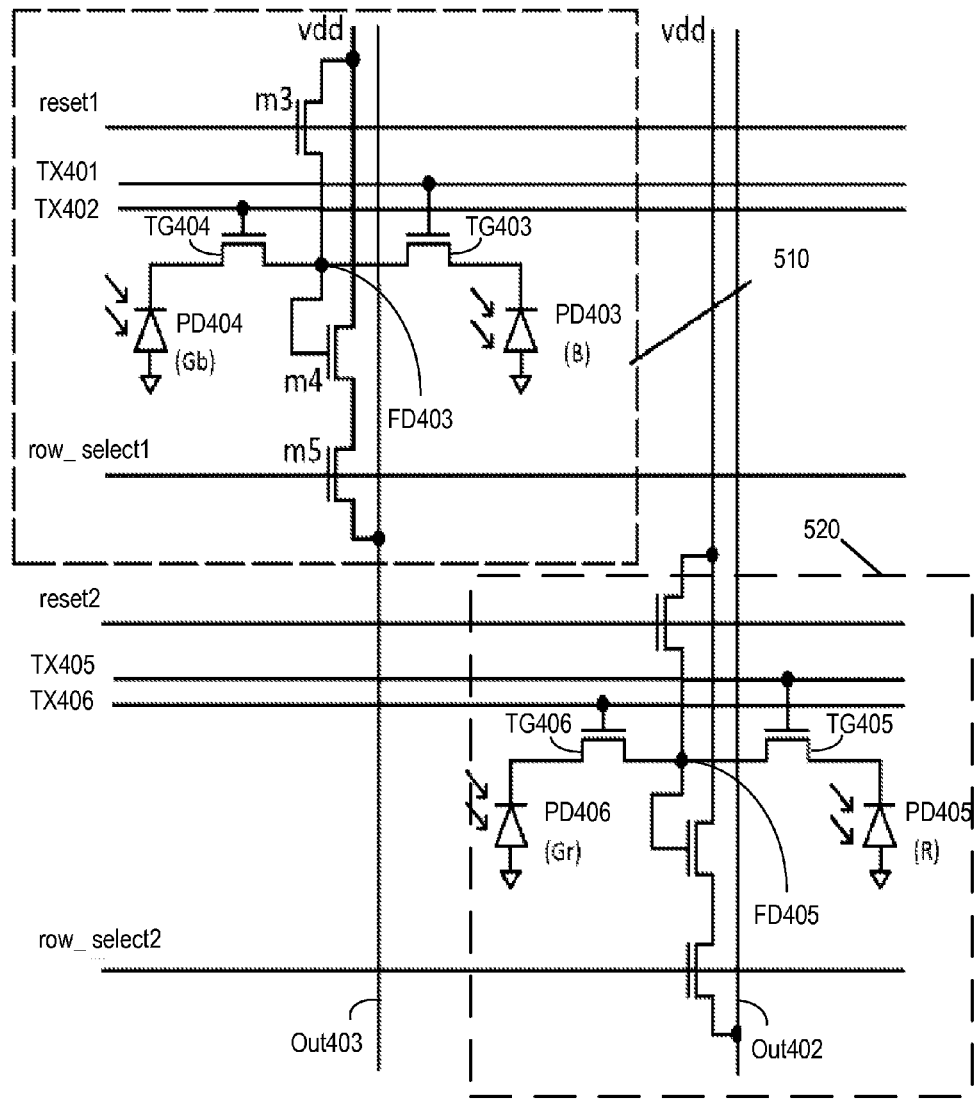
FIG. 5 is a circuit diagram representing an example of an image pixel structure, consistent with disclosed embodiments.

FIG. 5 depicts a circuit 500 representing at least part of image pixel structure 400 of FIG. 4. As shown in FIG. 5, circuit 500 includes a paired structure 510 and a paired structure 520. Paired structure 510 includes photodiodes PD403, PD404, and readout transistors TG403, TG404 of FIG. 4. The output of either one of photodiodes PD403 and PD404 can be connected to floating drain FD403, depending upon which one of transistors TG403 and TG404 is enabled and disabled. Transistors TG403 and TG404 are controlled by selection wires TX401 and TX402.

Reset transistor M3, buffer transistor M4, and selection transistor M5 can be included as part of or additional to, for example, transistor RG403 of FIG. 4. As described above, transistor RG403 provides conditioning (e.g., setting a voltage bias level) to the output of floating drain FD403. Reset transistor M3 is configured to reset floating drain FD403 by charging it to a voltage equal to supply voltage Vdd. The resetting allows previously-generated data (by either photodiodes PD404 or PD403), in the form of residual charges stored at floating drain FD403, to be substantially erased. As a result, when one of the photodiodes deposit charges at floating drain FD403 in response to sensed light, the charges stored at floating drain FD403 (and the resulting voltage) can reflect more accurately about an amount of charges actually deposited by the photodiode, and the sensitivity and accuracy of the image sensor can be improved. Reset transistor M3 is coupled with a reset1 wire, which can transmit a reset signal configured to reset all the paired structures (e.g., paired structure 510) within the first row of image pixel structure 400. A person with ordinary skill in the art will understand that reset transistor M3 can be configured to reset floating drain FD403 to any predetermined voltage and not necessarily to the supply voltage.

Buffer transistor M4 is configured as a source follower, with a drain terminal biased at supply voltage Vdd. Buffer transistor M4 can receive a voltage at drain FD403, and can generate an output voltage, with a pre-determined bias level, that tracks the change of the voltage at floating drain FD403. For example, when there is a voltage change at floating drain FD403, substantially the same change (in both magnitude and direction) can also occur for the output voltage of buffer transistor M4. Although FIG. 5 shows that buffer transistor M4 is configured as a source follower, a person with ordinary skill in the art will understand that other buffer configurations (e.g., common-gate, common-source, or any combination thereof) can be used to generate an output voltage based on a voltage at the floating drain.

The output of buffer transistor M4 is provided to selection transistor M5, which is configurable to provide the output voltage of transistor M4 to output wire Out403, when enabled by a control signal on a row_select1 wire. Row_select1 wire can transmit a signal configured to select the first row of image pixel structure 400 to obtain the data.

Circuit 500 also includes paired structure 520, which includes photodiodes PD405, PD406, and readout transistors TG405, TG406 of FIG. 4. The output of either one of photodiodes PD405 and PD406 can be connected to floating drain FD405, depending upon which one of transistors TG405 and TG406 is enabled and disabled. Transistors TG405 and TG406 are controlled by selection wires TX405 and TX406. Upon selection by a control signal on a row_select2 wire, the output of paired structure 520 can be provided to output wire Out402. The structure and operation of paired structure 520 is identical to paired structure 510 and their descriptions are not repeated. In some embodiments, wires reset1, reset2, row_select1, and row_select2 can be coupled with row access circuitry 103 of FIG. 1, which supplies the control signals. The timing of the control signals can be controlled by control block 109 of FIG. 1.

Figure 6:
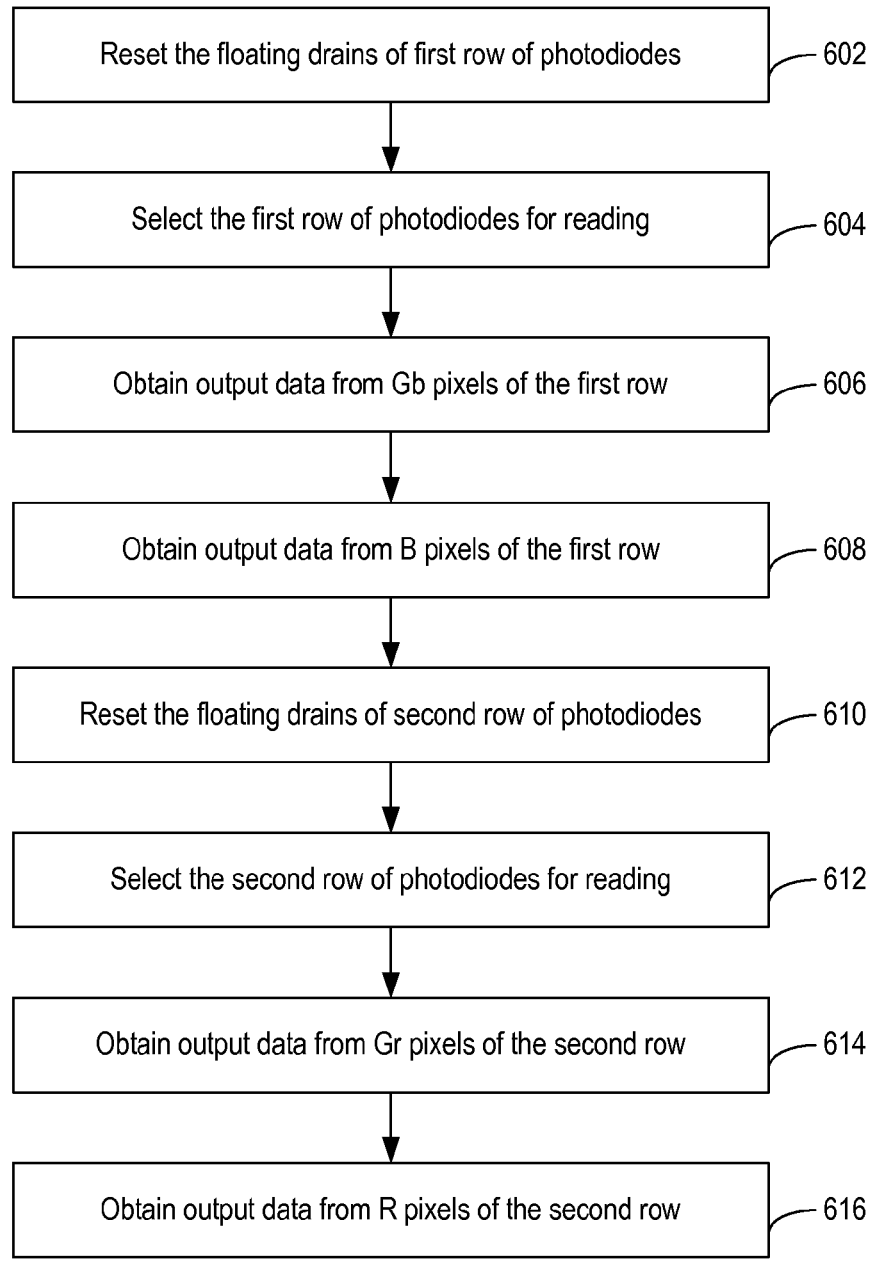
FIG. 6 is a flowchart illustrating an example of a method of acquiring data from an image sensor, consistent with disclosed embodiments.

FIG. 6 is a flowchart representing an exemplary method 600 for operating image pixel structure 400 as represented in FIGS. 4A, 4B, and 5. It will be readily appreciated that the illustrated procedure can be altered to include less or more steps.

In step 602, a circuitry (e.g., row access circuitry 103 of FIG. 1) resets the floating drains of first row of photodiodes (e.g., floating drains FD401 and FD403) by, for example, transmitting a control signal via reset1 wire of FIG. 5.

In step 604, the circuitry selects the first row of photodiodes for reading by, for example, transmitting a control signal via row_select1 wire of FIG. 5.

In step 606, the circuitry obtains output data from Gb pixels of the first row (e.g., photodiodes PD402 and PD404) by, for example, transmitting a first combination of control signals via selection wires TX401 and TX402 to enable transistors TG402 and transistors TG404, and to disable transistors TG401 and TG403. As a result, in step 606, floating drains FD401 and FD403 can transmit, respectively, the outputs of photodiodes PD402 and PD404, via output wires Out401 and Out 403 respectively. The outputs from the Gb pixels are then digitalized by, for example, comparators 104 of FIG. 1, and the digitalized Gb pixel data can be stored at storage block 105 of FIG. 1.

In step 608, the circuitry obtains output data from B pixels of the first row (e.g., photodiodes PD401 and PD403) by, for example, transmitting a second combination of control signals via selection wires TX401 and TX402 to disable transistors TG402 and TG404, and to enable transistors TG401 and TG403. As a result, in step 608, floating drains FD401 and FD403 can transmit, respectively, the outputs of photodiodes PD 401 and PD 403, via output wires Out401 and Out 403 respectively. The outputs from the B pixels are then digitalized by, for example, comparators 104 of FIG. 1, and the digitalized B pixel data can be stored at storage block 105 of FIG. 1. After step 608 completes, the pixel data of the first row of image pixel structure 400 have been obtained and stored at storage block 105.

In step 610, the circuitry resets the floating drains of second row of photodiodes (e.g., floating drain FD405) by, for example, transmitting a control signal via reset2 wire of FIG. 5.

In step 612, the circuitry selects the second row of photodiodes for reading by, for example, transmitting a control signal via row_select2 wire of FIG. 5.

In step 614, the circuitry obtains output data from Gr pixels of the second row (e.g., photodiode PD406) by, for example, transmitting a first combination of control signals via selection wires TX405 and TX406 to enable transistor TG406 and to disable transistor TG405. As a result, in step 614, floating drain FD405 can transmit the output of photodiode PD406 via output wire Out402. The outputs from the Gr pixels are then digitalized by, for example, comparators 104 of FIG. 1, and the digitalized Gr pixel data can be stored at storage block 105 of FIG. 1.

In step 616, the circuitry obtains output data from R pixels of the second row (e.g., photodiode PD405) by, for example, transmitting a second combination of control signals via selection wires TX405 and TX406 to disable transistor TG406 and to enable transistor TG405. As a result, in step 616, floating drain FD405 can transmit the output of photodiode PD405 via output wire Out402. The outputs from the R pixels are then digitalized by, for example, comparators 104 of FIG. 1, and the digitalized Gr pixel data can be stored at storage block 105 of FIG. 1.

After step 616 completes, the pixel data of the second row of image pixel structure 400 have been obtained and stored at storage block 105. Together with the pixel data of the first row of image pixel structure 400, the pixel data can be processed according to their position in the 2×2 Bayer pattern units. The circuitry can then proceed to steps 602-616 again for the next two rows of photodiodes.

An image sensor consistent with the present disclosure improves geometric uniformity between photodiodes designated as Gb and Gr pixels (e.g., the first and the fourth photodiodes), so that when the photodiodes are used as active pixels with a Bayer-pattern color filter, the difference in sensitivity between the Gb and Gr pixels can be reduced, and the effective image resolution of the image sensor can be improved. In some embodiments, an image sensor consistent with the present disclosure allows the Gb pixel to be accessed before the B pixel, and allows the Gr pixel to be accessed before the R pixel, such that time-domain uniformity between the Gb and Gr pixels can be improved as well, and the effective image resolution of the image sensor can be further improved. In some embodiments, pairs of pixels included in each row share common output nodes, allowing the number of circuits for processing the pixel data to be reduced.

In the preceding specification, the subject matter has been described with reference to specific exemplary embodiments. It will, however, be evident that various modifications and changes may be made without departing from the broader spirit and scope of the subject matter as set forth in the claims that follow. The specification and drawings are accordingly to be regarded as illustrative rather than restrictive. Other embodiments may be apparent to those skilled in the art from consideration of the specification and practice of the embodiments disclosed herein.

What is claimed is:

1. An image sensor comprising:
    at least a first row and a second row of photodiodes, each photodiode being coupled with an associated transistor, each associated transistor including a gate, the first and second row of photodiodes forming a series of 2×2 Bayer-pattern units;
    wherein: in each Bayer-pattern unit, a first photodiode and a second photodiode in the first row are designated respectively as a first green pixel and a blue pixel, and a third photodiode and a fourth photodiode in the second row are designated respectively as a red pixel and a second green pixel;
    a position of the gate of the transistor associated with the first photodiode relative to the first photodiode and a position of the gate of the transistor associated with the fourth photodiode relative to the fourth photodiode are the same; and
    for each Bayer-pattern unit, outputs of the two photodiodes in one of the first row and the second row are coupled to a common node, outputs of the two photodiodes in the other of the first row and the second row are coupled to different nodes, and each output of the two photodiodes in the other of the first row and the second row is coupled to another common node in a neighboring Bayer-pattern unit.

2. The image sensor of claim 1, wherein an orientation of the gate of the transistor associated with the first photodiode relative to the first photodiode and an orientation of the gate of the transistor associated with the fourth photodiode relative to the fourth photodiode are the same.

3. The image sensor of claim 1, wherein outputs of at least some of the photodiodes of each row are configured to be accessible at substantially the same time.

4. The image sensor of claim 1, wherein the first photodiode designated as the first green pixel and the fourth photodiode designated as the second green pixel are arranged diagonally within the 2×2 Bayer-pattern unit.

5. The image sensor of claim 1, wherein a position of the gate of the transistor associated with the second photodiode relative to the second photodiode and a position of the gate of the transistor associated with the third photodiode relative to the third photodiode are the same.

6. The image sensor of claim 1, wherein: the first photodiode and an adjacent photodiode in the same row are coupled to a first common node, the first common node being configured to provide an output of one of the first photodiode and the adjacent photodiode.

7. The image sensor of claim 6, wherein:
    the transistor associated with the first photodiode and the transistor associated with the adjacent photodiode are configured to select one of outputs of the first photodiode and the adjacent photodiode to be propagated at the first common node.

8. The image sensor of claim 7, further comprising a reset transistor coupled with the first common node, wherein the reset transistor is configurable to set a predetermined voltage at the first common node.

9. The image sensor of claim 7, further comprising a buffer transistor coupled with the first common node, wherein the buffer transistor is configured to generate an output voltage based on a voltage at the first common node.

10. The image sensor of claim 7, further comprising a selection transistor, wherein the selection transistor is configurable to transmit a voltage at the first common node.

11. The image sensor of claim 1, wherein the third photodiode is coupled with the fourth photodiode at a second common node.

12. The image sensor of claim 1, wherein:
the gate of the transistor associated with the first photodiode is coupled with a first control line;
the gate of the transistor associated with the second photodiode is coupled with a second control line;
the gate of the transistor associated with the third photodiode is coupled with a third control line; and
the gate of the transistor associated with the fourth photodiode is coupled with a fourth control line.

13. The image sensor of claim 12, wherein the first, second, third, and fourth control lines are configured to enable the first photodiode to be selected to provide an output before the second photodiode, and the fourth photodiode to be selected to provide an output before the third photodiode.

14. The image sensor of claim 12, wherein the first, second, third, and fourth control lines are configured to enable the first photodiode, the second photodiode, the third photodiode, and the fourth photodiode to be selected individually to provide one or more outputs at different times.

15. A method of acquiring an output of an image sensor, the image sensor comprising a series of a two rows by two columns Bayer-pattern units, the method comprising:
obtaining an output generated by a first photodiode before acquiring an output generated by a second photodiode; and
obtaining an output generated by a fourth photodiode before acquiring an output generated by a third photodiode,
wherein for each Bayer-pattern unit: the four photodiodes are respectively disposed at four positions corresponding to the two rows by the two columns,
the first photodiode designated as a first green pixel, the second photodiode designated as a blue pixel, the third photodiode designated as a red pixel, and the fourth photodiode designated as a second green pixel, and
outputs of the two photodiodes in one of a first row and a second row of the two rows are coupled to a first common node, outputs of the two photodiodes in the other of the first row and the second row are coupled to different nodes, and each output of the two photodiodes in the other of the first row and the second row is coupled to a second common node in a neighboring Bayer-pattern unit.

16. The method of claim 15, wherein obtaining an output generated by the fourth photodiode before acquiring an output generated by the third photodiode further comprises:
resetting the first common node;
obtaining the output generated by the fourth photodiode after resetting the first common node; and
obtaining the output generated by the third photodiode after obtaining the output generated by the fourth photodiode.

17. An image sensor comprising:
at least a first row and a second row of photodiodes, each photodiode being coupled with an associated transistor, each associated transistor including a gate;
wherein, the first and second row of photodiodes form a series of 2×2 units, each unit including a first photodiode, a second photodiode, a third photodiode, and a fourth photodiode, and the first and the fourth photodiodes are arranged diagonally and the second and the third photodiodes are arranged diagonally, and a position of a gate of a transistor associated with the first photodiode relative to the first photodiode is the same as a position of a gate of a transistor associated with the fourth photodiode relative to the fourth photodiode; and
for each 2×2 unit, outputs of the two photodiodes in one of the first row and the second row are coupled to a first common node, outputs of the two photodiodes in the other of the first row and the second row are coupled to different nodes, and each output of the two photodiodes in the other of the first row and the second row is coupled to a second common node in a neighboring 2×2 unit.

18. The image sensor of claim 17, wherein an orientation of the gate of the transistor for the first photodiode relative to the first photodiode and an orientation of the gate of the transistor for the fourth photodiode relative to the fourth photodiode are the same.

19. The image sensor of claim 17, wherein each associated transistor is provided with a control line.

20. The image sensor of claim 17, wherein the common nodes are configured to read out signals from the associated photodiodes.

21. The image sensor of claim 1, wherein the geometric relationship between the first photodiode and any neighboring photodiode and associated transistor is identical to that between the fourth photodiode and any neighboring photodiode and associated transistor.

22. The image sensor of claim 1, wherein the geometric relationship between the second photodiode and any neighboring photodiode and associated transistor is identical to that between the third photodiode and any neighboring photodiode and associated transistor.

23. The image sensor of claim 2, wherein the transistor associated with the first photodiode is positioned at a corner of the first photodiode and the transistor associated with the fourth photodiode is positioned at a corner of the fourth photodiode.

* * * * *